United States Patent [19]
Sato

[11] Patent Number: 5,917,833
[45] Date of Patent: Jun. 29, 1999

[54] TESTING APPARATUS FOR SEMICONDUCTOR DEVICE

[75] Inventor: Tsunehiro Sato, Yokohama, Japan

[73] Assignee: Kabushiki Kaisha Toshiba, Kawasaki, Japan

[21] Appl. No.: 08/988,471

[22] Filed: Dec. 10, 1997

[30] Foreign Application Priority Data

Dec. 10, 1996 [JP] Japan .................................. 8-329971

[51] Int. Cl.[6] .............................. G11C 29/00; G11C 7/00
[52] U.S. Cl. .......................................... 371/21.1; 365/201
[58] Field of Search ................................. 371/21.1, 21.2,
371/21.6, 27.5, 27.6, 27.7; 365/201; 395/183.01,
183.18

[56] References Cited

U.S. PATENT DOCUMENTS

| | | | |
|---|---|---|---|
| 5,410,687 | 4/1995 | Fujisaki et al. | .................... 371/10.3 X |
| 5,481,671 | 1/1996 | Fujisaki | .............................. 395/182.06 |
| 5,539,699 | 7/1996 | Sato | ........................................ 365/201 |
| 5,835,428 | 11/1998 | Kobayashi | .............................. 365/201 |
| 5,841,785 | 11/1998 | Suzuki | .................................... 371/27.1 |

Primary Examiner—Hoa T. Nguyen
Attorney, Agent, or Firm—Foley & Lardner

[57] ABSTRACT

A testing apparatus for semiconductor device capable of preventing reduction in the number of devices to be simultaneously measured is provided. Address of a measurement section of a semiconductor device to be measured, input data inputted to the measurement section and expected data to be outputted from the semiconductor device when the input data is inputted are generated by an ALPG. Output data actually outputted from the semiconductor device when the input data is inputted and expected data are compared with each other at a comparison unit. Comparison result is outputted as fail information. By a test pass control unit, there is generated test pass information for selecting fail information on the basis of divisional test information inputted in the case where the cycle time of test is faster than the cycle time of the fail information storage memory. Memory cell within the fail information storage memory is selected on the basis of address of the measurement section. Thus, fail information is written into the selected memory cell on the basis of test pass information by a fail information write control unit.

6 Claims, 6 Drawing Sheets

TESTING APPARATUS FOR SEMICONDUCTOR DEVICE

FIELD OF THE INVENTION

This invention relates to a testing apparatus for semiconductor device which tests semiconductor device.

PRIOR ART

The configuration of a conventional testing apparatus for testing semiconductor device by using failure analysis memory is shown in FIG. 4. This conventional testing apparatus comprises a CPU 2, an ALPG (Algorithmic Pattern Generator) 4, a write control section 8, a comparator 10, a fail information control section 12, and failure analysis memories 141, ... 14n.

The configuration and the operation of this conventional testing apparatus will be described in a manner classified into the case a) where cycle time of test is longer than cycle time of the failure analysis memory and the case b) where the former is shorter than the latter.

Test in the case where the cycle time of test is slower than the cycle time of the failure analysis memory (i.e. the operation speed of test is lower than the operation speed of the failure analysis memory) is carried out as follows. Initially, test start command is sent from the CPU 2 to the ALPG4. In response thereto, address information and input data for test are sent from the ALPG 4 to a semiconductor device to be tested (hereinafter referred to as DUT (Device Under Test) as occasion may demand) 7. Thus, data is written into, e.g., memory cell of the DUT 7 corresponding to this address information. After data is written into the memory cell, read-out operation thereof is carried out. Expected data (data which should have been written) and data which has been read out are compared with each other at the comparator 10. This comparison result (hereinafter referred to as fail information) is sent to failure analysis memories (hereinafter referred to as FAM as occasion may demand) through a fail information control section 12 (see FIGS. 4 and 5).

Moreover, the address information from the ALPG4 is sent also to the write control section 8, at which this address information is converted into corresponding address of the FAM $14_1, \ldots 14_n$. Then, the fail information F1, F2 ... are written into memory cells of FAM of the converted address on the base of memory select information from the write control section 8. In this example, respective FAM $14_i$ (i=1, ... n) have capacity of m×1 bits, and fail information F1, F2, ... are written in order into the FAM every cycle time of the FAM (see FIG. 5).

On the other hand, test in the case where the cycle time of test is faster than the cycle time of the failure analysis memory (e.g., in the case where the cycle time of test is one half (½) of the cycle time of failure analysis memory, i.e., the operation speed of test is twice greater than the operation speed of the FAM) is carried out as follows. First, interleave information is sent from the CPU2 to the write control section 8 and the fail information control section 12. Thus, n failure analysis memories $14_1 \ldots 14_n$ are classified into two groups. Subsequently, test start command is sent from the CPU2 to the ALPG4. Responding to this, input data for test is sent from the ALPG4 to the DUT7. Thus, the above-mentioned data is written into the memory cell of the DUT7 corresponding to this address information. Thereafter, read-out operation thereof is carried out. Thus, expected data and the data which has been read out are compared with each other at the comparator 10. Then, fail information F1, F2, F3, ... are sent to the FAM $14_1 \ldots 14_n$ through the fail information control section 12 (see FIG. 6).

Moreover, the above-mentioned address information is sent from the ALPG4 also to the write control section 8, at which this address information is converted into corresponding address of FAM $14_i$ (i=1 ... n). Then, the above-mentioned fail information F1, F2,, are written into memory cells of FAM $14_i$ (i=1, ... n) of the converted address on the basis of memory select information from the write control section 8.

The odd, i.e., the first, the third ... fail information F1, F3 ... are respectively written into memory cells of the first, third, ... addresses of FAM $14_1$ of the first group, and even, i.e., the second, fourth fail ... information F2, F4, are respectively written into memory cells of the second, fourth ... addresses of the FAM $14_2$ of the second group (see FIG. 6). In this case, the first and second fail information F1, F2 are respectively written into FAM$14_1$ of the first group and FAM$14_2$ of the second group within the cycle time of the same failure analysis memory (see FIG. 6).

At present, the failure analysis memory of the testing apparatus has a tendency to increase with (1) realization of large capacity of the semiconductor device (DUT), (2) realization of simultaneous measurement of a large number of semiconductor devices (DUT), and (3) realization of test speed (cycle) of semiconductor devices (DUT).

As described above, in the conventional testing apparatus, in the case where the operation speed of the semiconductor device to be measured is higher than the operation speed of semiconductor elements constituting the failure analysis memory, the failure analysis memory was interleaved to store fail information in a distributed manner.

For this reason, there was the problem that the number of semiconductor devices to be measured is reduced by restriction of capacity of the failure analysis memory in carrying out measurement at a high speed, so cost required for test is increased.

In addition, although it is conceivable to increase capacity of the failure analysis memory in order to increase the number of devices to be measured, since semiconductor elements constituting the failure analysis memory is expensive, the testing apparatus becomes expensive, so the cost required for test is increased.

SUMMARY OF THE INVENTION

This invention has been made in consideration of circumstances as described above, and its object is to provide a testing apparatus for semiconductor device, which is capable of preventing, as far as possible, reduction of the number of semiconductor devices to be measured at the same time.

A testing apparatus for semiconductor device according to this invention comprises:

an ALPG for generating address of a measurement section of a semiconductor device to be measured, input data inputted to the measurement section, and expected data to be outputted from the semiconductor device when the input data is inputted;

a comparison unit for comparing output data actually outputted from the semiconductor device when the input data is inputted and the expected data to output the comparison result as fail information;

plural fail information storage memories in which the fail information are stored;

a test pass control unit operative to generate test pass information for selecting fail information on the basis of divisional test information inputted in the case where the cycle time of test is faster than the cycle time of the fail information storage memory; and a write control unit for selecting memory cell within the fail information storage memory on the basis of address of the measurement section to write the fail information into the selected memory cell on the basis of the test pass information.

Moreover, it is preferable that the apparatus further comprises CPU for judging whether or not the cycle time of test is slower than the cycle time of the fail information storage memory, whereby when the former is slower than the latter or is the same as the latter, it outputs test start command to the ALPG, while when the former is faster than the latter, it outputs test start command to the ALPG and outputs divisional test information to the test pass control unit.

Further, the apparatus may be of the configuration in which the apparatus further comprises a fail information control unit for sending the fail information to the plural fail information storage memories in synchronism with the cycle of the test, and the write control unit selects fail information sent from the fail information control unit on the basis of the test pass information to write the selected fail information into the selected memory cell.

In addition, it is preferable that CPU is caused to be of structure such that in the case where the cycle time of test is shorter than the cycle time of the fail information storage memory, it determines the number of cycles for taking fail information into the fail information storage memory in a distributed manner to output, to the test pass control unit, as the divisional test information, information indicating cycle where the fail information is to be taken in.

EMBODIMENT

Figure 1:
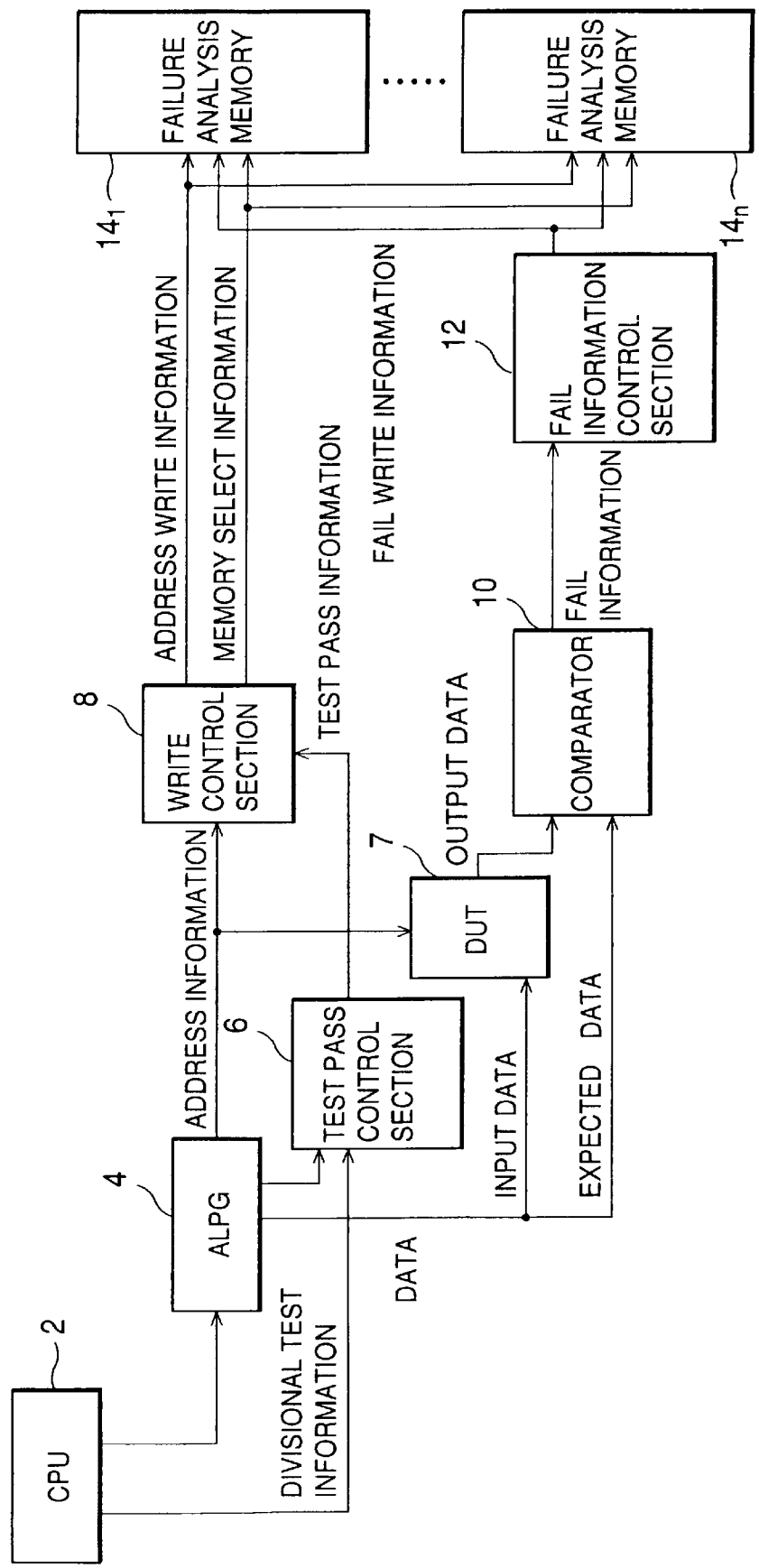
FIG. 1 is a block diagram showing the configuration of an embodiment of a testing apparatus according to this invention.
Figure 4:
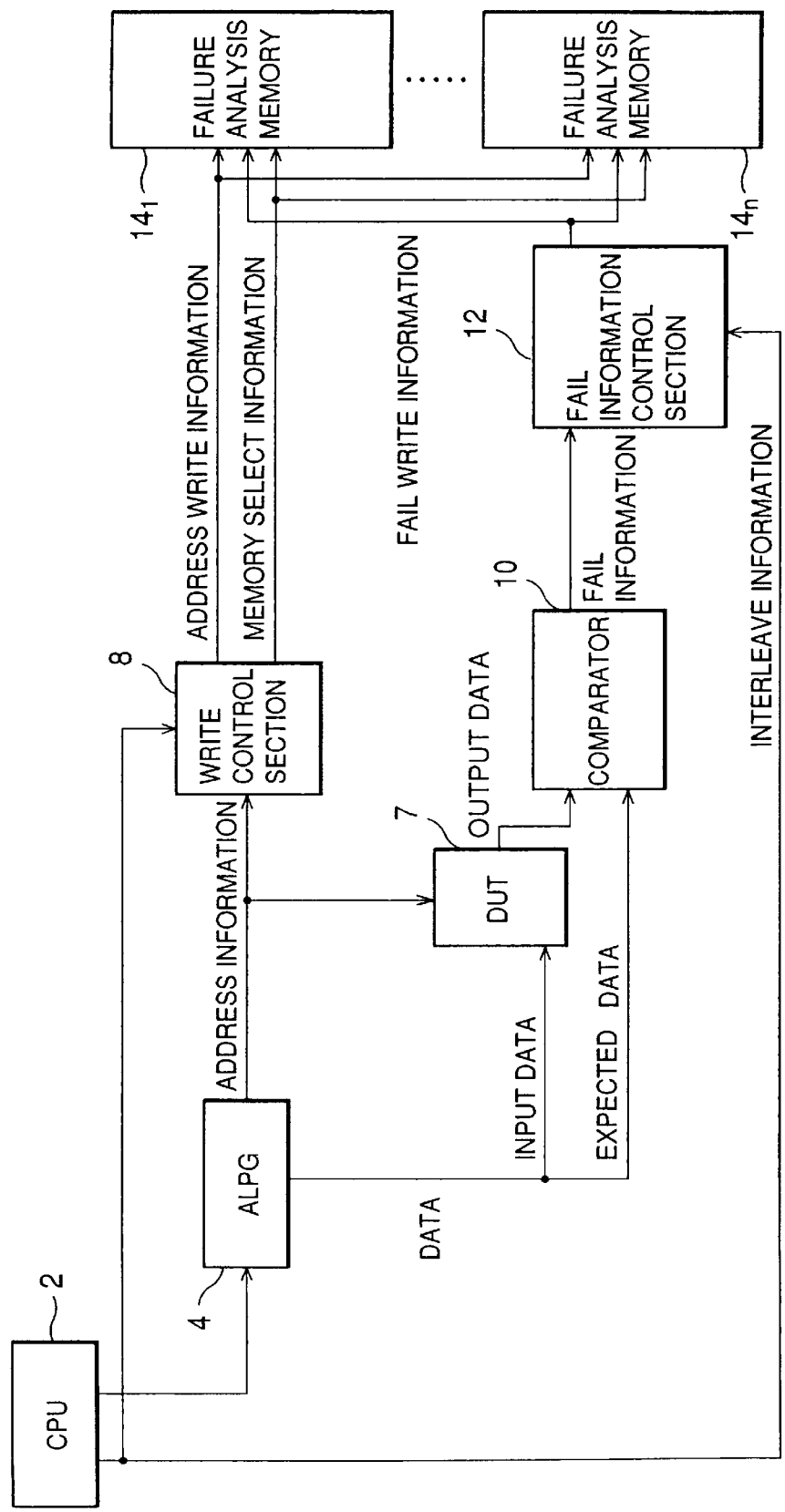
FIG. 4 is a block diagram showing the configuration of a conventional testing apparatus.

The configuration of an embodiment of a testing apparatus for semiconductor device according to this invention is shown in FIG. 1. The testing apparatus of this embodiment is of the structure in which a test pass control section 6 is newly provided in the conventional testing apparatus shown in FIG. 4. This test pass control section 6 generates test pass information on the basis of test cycle clock sent from ALPG4 and divisional test information sent from the CPU2 in the case where the cycle time of test is shorter than the cycle time of the failure analysis memory to send it to write control section 8.

Figure 2:
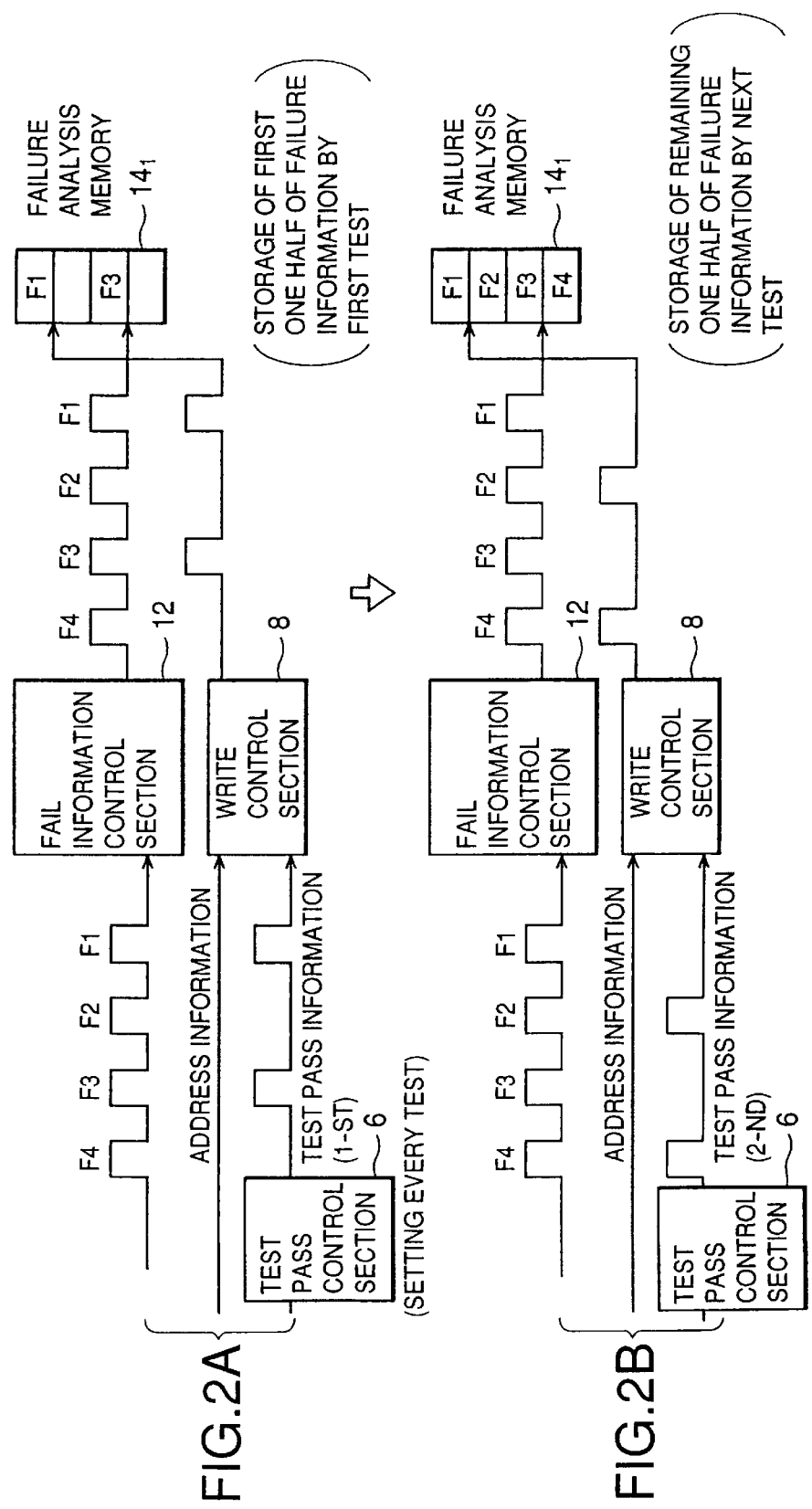
FIGS. 2A and 2B are explanatory views for explaining the operation of the embodiment.

The operation of the testing apparatus of this embodiment will now be described with reference to FIGS. 2 and 3.

Figure 3:
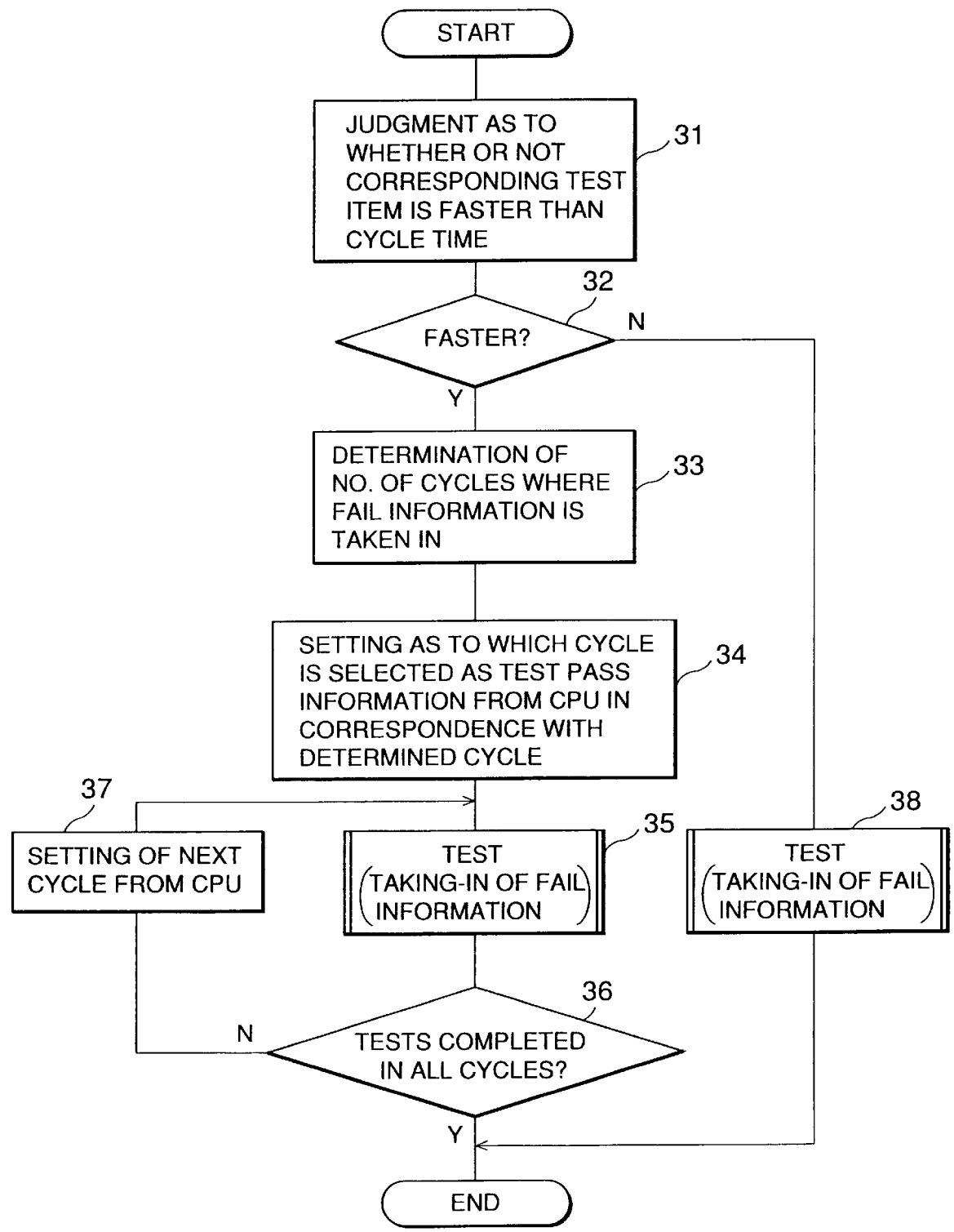
FIG. 3 is a flowchart for explaining the operation of the embodiment.
Figure 5:
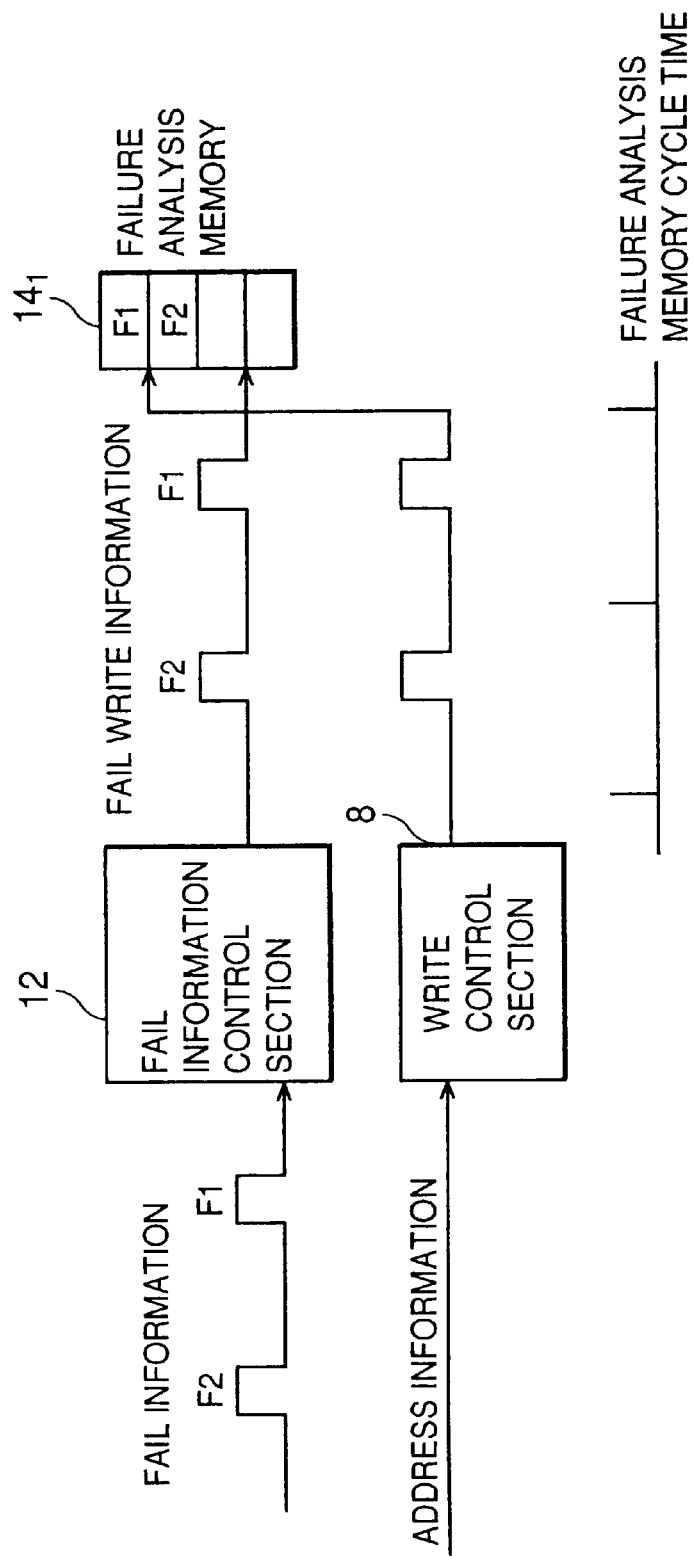
FIG. 5 is an explanatory view for explaining the operation of the conventional testing apparatus.
Figure 6:
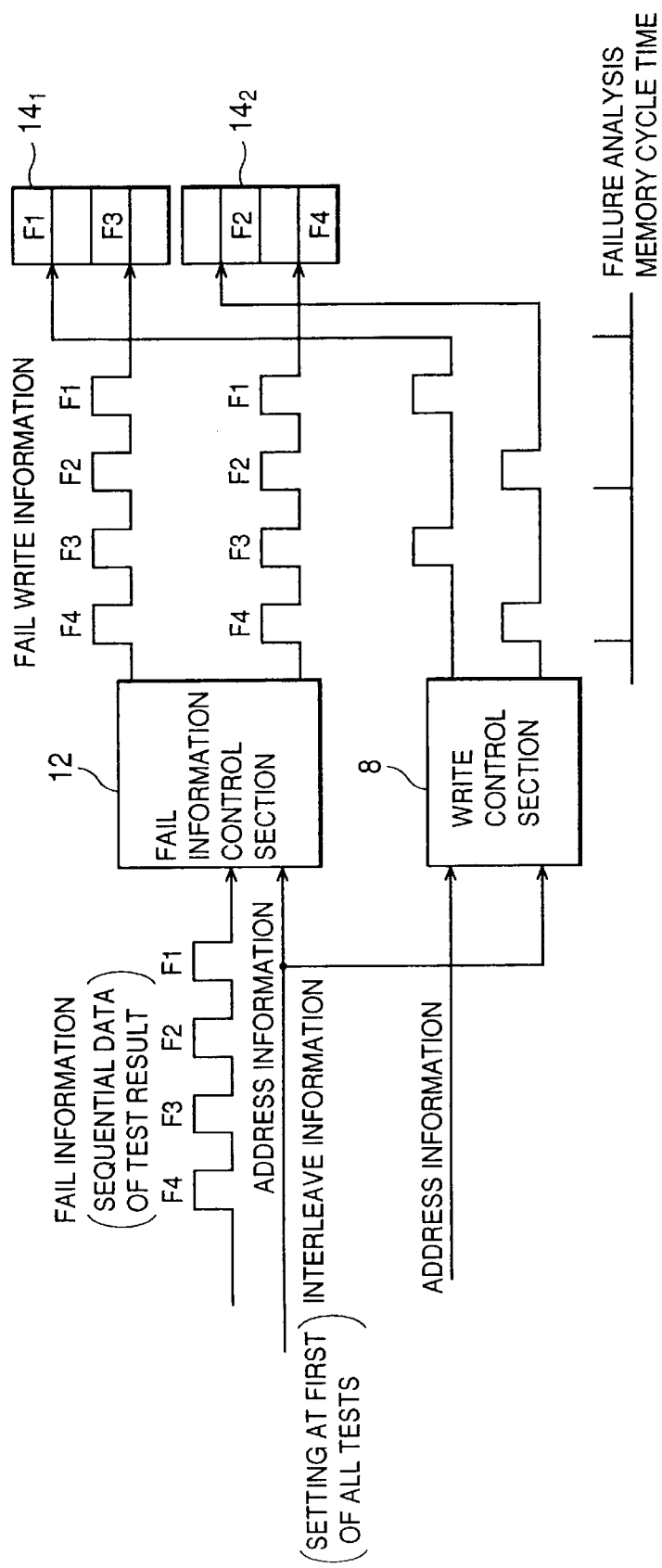
FIG. 6 is an explanatory view for explaining the operation of the conventional testing apparatus.

Initially, whether the cycle time of test is slower than the cycle time of the failure analysis memory, i.e. operation speed of test is lower than operation speed of FAM is judged by the CPU 2 (see steps 31, 32 of FIG. 3). As a result, in the case where the former is slower than the latter, the processing operation proceeds to step 38 through N(NO) of the decision step 32 labeled "FASTER". At this step, taking-in operation of fail information is carried out in a manner similar to the case of FIG. 5 which has been described in the prior art. Namely, test start command is sent from the CPU2 to the ALPG4. Thus, address information and input data for test are sent from the ALPG4 to DUT7. As a result, data is written into, e.g., memory cell of the DUT7 corresponding to this address information. After such data is written, data is read out from the memory cell. Thus, expected data and the data which has been read out are compared with each other at comparator 10. This comparison result (fail information) is sent to FAM $14_1, \ldots 14_n$ through fail information control section 12 as shown in FIG. 5.

Moreover, the address information from the ALPG4 is sent also to the write control section 8, at which this address information is converted into corresponding address of FAM $14_1, \ldots 14_n$. Further, the fail information F1, F2, . . . are written into memory cells of FAM of the converted address on the basis of memory select information from the write control section 8. In this case, fail information F1, F2, . . . are written into FAM in order every cycle time of FAM as shown in FIG. 5.

On the other hand, as indicated by step 32 of FIG. 3, in the case where cycle time of test is faster than cycle time of the failure analysis memory, e.g., in the case where cycle time of test is one half (½) of cycle time of FAM, i.e., in the case where operation speed of test is twice greater than operation speed of FAM, the processing operation proceeds, through Y(YES) of the decision step 32, to step 33, at which the number of cycles where fail information are taken in in a distributed manner is determined. In this embodiment, since the operation speed of test is twice greater than the operation speed of FAM, fail information are taken in in a manner distributed into two cycles. Subsequently, as indicated by step 34, which cycle is selected as pass information of test is set by CPU2 in dependency upon the determination result. This set information is sent to the test pass control section 6 from the CPU2 as divisional test information.

Then, test start command is sent from the CPU2 to the ALPG4. Thus, the first test cycle is started (see step 35). Namely, input data for test is sent from the ALPG4 to the DUT7, address information is sent from the ALPG4 to the write control section 8, and test cycle clock is sent from the ALPG4 to the test pass control section 6. Thus, the input data is written into the memory cell of the DUT7 corresponding to the address information. Thereafter, read-out operation is carried out. Expected data and the data which has been read out are compared with each other at the comparator 10. Then, as shown in FIG. 2A, fail information F1, F2, F3 . . . are sent to FAM through the fail information control section 12. At this time, at the write control section, address information from the ALPG4 is converted into memory select information indicating which FAM is selected from plural FAM $14_1, \ldots 14_n$ and address write information indicating memory cell of the address of the selected FAM into which input data is written. The converted information thus obtained are sent to FAM. In addition, test pass information is also sent to the FAM. In this embodiment, test pass information at the time of the first test cycle is information for selecting the first, second, third . . . , i.e., odd fail information F1, P3 as shown in FIG. 2A.

When the above-described information is sent to the FAM, fail information F1, F3 are written into the memory cells of FAM selected by the memory select information and the address write information in accordance with test pass information. Namely, at the time of the first test, the first fail information F1 is written into memory area indicated by the first address of FAM $14_1$, and the third fail information F3 is written into memory area indicated by the third address of FAM $14_1$ in this order.

When the first test cycle is completed in this way, whether or not any remaining test cycle exists is judged at the CPU2. In the case where such remaining cycle exists, the processing operation proceeds to step 37, at which the next test cycle is set by the CPU2. Thereafter, the processing operation proceeds to step 35. In a manner similar to the above, the second test cycle is started. In the second test cycle, as shown in FIG. 2B, test pass information is information for selecting the second, fourth, . . . , i.e., even fail information F2, F4 . . . . Accordingly, in the second test cycle, the second fail information is written into memory area indicated by the second address of FAM $14_1$ and the fourth fail information is written into memory area indicated by the fourth address of FAM $14_1$ in this order (see FIG. 2B). In the case where it is judged at step 36 that any remaining cycle does not exist, the test is completed.

As described above, even in the test cycle is fast, i.e., in the case where the test operation is fast, fail information are written into memory cells of FAM corresponding to memory cells of the DUT7 without necessity to interleave plural FAMs. Thus, it can be prevented that capacity of FAM is increased and/or the number of semiconductor devices simultaneously measured is reduced.

In the case where the cycle time of test is faster than the cycle time of FAM, i.e., in the case where the test operation is faster than the operation of FAM, the number of tests is increased. However, in general, in the test in which the operation of test is faster than the operation of FAM, even if the number of tests of semiconductor device is increased, the entire test time is not so increased. Thus, the cost required for test is not increased to much degree.

It is to be noted that while DUT7 is semiconductor memory unit such as DRAM or SRAM, etc. in the above-described embodiment, DUT7 may be logical circuit unit. In this case, expected data is not necessarily in correspondence with input data.

As described above, in accordance with this invention, reduction in the number of semiconductor devices simultaneously measured can be prevented as far as possible.

What is claimed is:

1. A testing apparatus for semiconductor device, comprising:

an ALPG for generating address of a measurement section of a semiconductor device to be measured, input data inputted to the measurement section, and expected data to be outputted from the semiconductor device when the input data is inputted;

a comparison unit for comparing output data actually outputted from the semiconductor device when the input data is inputted and the expected data to output comparison result as fail information;

plural fail information storage memories in which the fail information are stored;

a test pass control unit operative to generate test pass information for selecting fail information on the basis of divisional test information inputted in the case where cycle time of test is faster than cycle time of the fail information storage memory; and a write control unit operative to select memory cell within the fail information storage memory on the basis of address of the measurement section to write the fail information into the selected memory cell on the basis of the test pass information.

2. A testing apparatus for semiconductor device as set forth in claim 1, wherein the semiconductor device is a semiconductor memory unit, the input data is data to be written into memory cell of the semiconductor memory unit, and the expected data is data to be obtained when the input data is written and is then read out and has the same value as the input data.

3. A testing apparatus for semiconductor device as set forth in claim 1, which comprises a CPU for judging whether or not cycle time of test is slower than cycle time of the fail information storage memory, whereby when the former is longer than the latter, or is the same as the latter, it outputs test start command to the ALPG, while when the former is shorter than the latter, it outputs test start command to the ALPG and outputs divisional test information to the test pass control unit.

4. A testing device for semiconductor device as set forth in claim 1, which further comprises a fail information control unit for sending the fail information to the plural fail information storage memories in synchronism with cycle of test, whereby the write control unit selects any one of fail information sent from the fail information control unit on the basis of the test pass information to write the selected fail information into the selected memory cell.

5. A testing apparatus for semiconductor device as set forth in claim 4, which comprises a CPU for judging whether or not cycle time of test is slower than cycle time of the fail information storage memory, whereby when the former is longer than the latter, or is the same as the latter, it outputs test start command to the ALPG, while when the former is shorter than the latter, it outputs test start command to the ALPG and outputs divisional test information to the test pass control unit.

6. A testing apparatus for semiconductor device as set forth in claim 5, wherein in the case where the cycle time of test is faster than the cycle time of the fail information storage memory, the CPU determines the number of cycles for taking fail information into the fail information storage memory in a distributed manner to output, on the basis of the determination result, information indicating cycle where the fail information is to be taken in to the test pass control unit as the divisional test information.

* * * * *